US006150699A

United States Patent [19]

Wakabayashi

[11] Patent Number: 6,150,699

[45] **Date of Patent: *Nov. 21, 2000**

[54] TRI-VOLTAGE BI-CMOS SEMICONDUCTOR DEVICE

[75] Inventor: Masaru Wakabayashi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/033,675

[22] Filed: Mar. 3, 1998

[30] Foreign Application Priority Data

Mar. 3, 1997 [JP] Japan .................................... 9-047878

[51] Int. Cl.[7] ........................... H01L 29/76; H01L 29/94; H01L 31/062; H01L 29/00

[52] U.S. Cl. .......................... 257/378; 257/370; 257/371; 257/549

[58] Field of Search .................................... 257/370, 378, 257/371, 549

[56] References Cited

U.S. PATENT DOCUMENTS

| | | | |
|---|---|---|---|
| 5,105,252 | 4/1992 | Kim et al. | 257/378 |
| 5,376,816 | 12/1994 | Nishigoori et al. | 257/378 |

FOREIGN PATENT DOCUMENTS

| | | | |
|---|---|---|---|
| 63-311723 | 12/1988 | Japan | 257/378 |
| 3-126256 | 5/1991 | Japan | 257/378 |
| 4-23147 | 2/1992 | Japan | 257/378 |
| 5-198754 | 8/1993 | Japan | 257/378 |

*Primary Examiner*—Steven H. Loke
*Attorney, Agent, or Firm*—Young & Thompson

[57] ABSTRACT

A Bi-CMOS semiconductor device having a CMOS device region and a bipolar transistor region is provided wherein the bipolar transistor has a collector region of a first conductivity type and the CMOS region has at least one element region of a second conductivity type which is positioned adjacent to the collector region as well as wherein a single buried layer of the first conductivity type is provided which extends under the element region of the CMOS region and the collector region.

11 Claims, 11 Drawing Sheets

VEE2 16 33 15 42 35 37 34 41 31 VDD 36 42 Nwell P N Pwell N P 32 Nepi N N Nwell 28 21 N+ P⁻ N⁻ N+ Psub VEE1 25 2 27 24 22 23 1 26

TRI-VOLTAGE BI-CMOS SEMICONDUCTOR DEVICE

BACKGROUND OF THE INVENTION

The present invention relates to a method of forming an improved Bi-CMOS semiconductor device.

The Bi-CMOS semiconductor device has an integration of a complementary MOS device having a pair of n-channel and p-channel MOS field effect transistors and a bipolar transistor. The bipolar transistor exhibits high speed performances, whilst the CMOS device shows a switching operation with a small current or a small power and has a small occupied area.

The Bi-CMOS semiconductor devices may be integrated as a circuitry which includes transistor-transistor logic (TTL) circuit and emitter-coupled logic (ECL) circuitry. Some of the transistor-transistor logic (TTL) circuit comprise only bipolar transistors, whilst another of the transistor—transistor logic (TTL) circuits comprises an integration of the CMOS device and the bipolar transistor. Namely, a Bi-CMOS TTL circuit has the integration of the CMOS device and the bipolar transistor. The emitter-coupled logic (ECL) circuit has the bipolar transistors.

Usually, both the transistor-transistor logic (TTL) circuit and the emitter-coupled logic (ECL) circuit may be integrated and both circuits are applied with power voltages different from each other. For example, the transistor-transistor logic (TTL) circuit is connected to a high voltage line applied with a voltage of 3.3V and a ground line having the ground potential, whilst the emitter-coupled logic (ECL) circuit is connected to a high voltage line applied with a voltage of 3.3V and a low voltage line applied with a voltage of −2V In this case, the high voltage line applied with a voltage of 3.3V is commonly used for both the transistor-transistor logic (TTL) circuit and the emitter-coupled logic (ECL) circuit. The ground line having the ground potential is connected to the transistor-transistor logic (TTL) circuit. The low voltage line applied with a voltage of −2V is connected to the emitter-coupled logic (ECL) circuit.

When the transistor-transistor logic (TTL) circuit and the emitter-coupled logic (ECL) circuit are integrated on a semiconductor chip, the transistor-transistor logic (TTL) circuit and the emitter-coupled logic (ECL) circuit receive power voltages different from each other, for which reason it is required to electrically isolate the transistor-transistor logic (TTL) circuit from the emitter-coupled logic (ECL) circuit. Since the transistor-transistor logic (TTL) circuit has both the CMOS device and the bipolar transistor, it is also required to electrically isolate the CMOS device from the bipolar transistor.

If the electrical isolation between the transistor-transistor logic (TTL) circuit and the emitter-coupled logic (ECL) circuit is incomplete, then noises generated in any one of the transistor-transistor logic (TTL) circuit and the emitter-coupled logic (ECL) circuit may provide an influence to the opposite one in operation. Also if the electrical isolation between the CMOS device and the bipolar transistor is incomplete, then noises generated in any one of the CMOS device and the bipolar transistor may provide an influence to the opposite one in operation.

In any event, the CMOS device and the bipolar transistor are integrated in a single epitaxial layer of p-type or n-type which is formed over a semiconductor substrate, wherein the CMOS device and the bipolar transistor are positioned adjacent to each other but electrically isolated from each other.

Since the complete electrical isolation between the CMOS device and the bipolar transistor is required, a p-well region and an n-well region are provided at a boundary between the CMOS device region and the bipolar transistor region wherein one of the p-well region and the n-well region is formed in the form of island in the other one of the p-well region and the n-well region. Namely, the p-well region and the n-well region form double surrounding structure whereby the occupied area of the Bi-CMOS device is enlarged. This means that the density of the integration of low.

In the Japanese laid-open patent publication No. 3-80565, it is disclosed that the n-channel MOS field effect transistor and the n-p-n bipolar transistor are isolated by the p-well in a plane view. Laminations of a low impurity concentration n-type buried layer and a high impurity concentration n-type buried layer are provided under the n-channel MOS field effect transistor and the n-p-n bipolar transistors so that the n-p-n bipolar transistor has a parasitic capacitance reduced by the buried layer. The reduction in parasitic capacitor of the n-p-n bipolar transistor shortens a delay time of signal transmission.

Since, however, the p-well is provided between the n-channel MOS transistor region and the n-p-n bipolar transistor region to isolate the n-channel MOS transistor region from the n-p-n bipolar transistor region.

This structure makes it difficult to reduce the occupied area of the Bi-CMOS semiconductor device.

In the Japanese laid-open patent publication No. 62-174965, there is disclosed an invertor circuit having the Bi-CMOS semiconductor device. An n+-type buried layer is formed over a p-type semiconductor substrate. An n-type epitaxial layer is formed on the n+-type buried layer. A p-channel MOS field effect transistor and an n-p-n bipolar transistor are formed in the n-type epitaxial layer. A p+-type buried layer is also formed over the p-type semiconductor substrate. A p-type region is formed over the p+-type buried layer. An n-channel MOS field effect transistor and a p-n-p bipolar transistor are formed in the p-type region. The MOS transistors and the bipolar transistors are formed in the n-type epitaxial layer and the p-type region. In each of the n-type epitaxial layer and the p-type region, the MOS field effect transistor and the bipolar transistor commonly use the drain region and the base region so as to increase the density of the integration of the Bi-CMOS semiconductor device.

The above circuit structure can be applicable only to the invertor circuit, but it is difficult to apply the above circuit structure to the circuits wherein the CMOS device and the bipolar transistors receive different power voltages.

In the Japanese patent publication No. 7-44231, it is disclosed that the Bi-CMOS semiconductor device has an island structure of the CMOS device region in order to prevent noises generated from the CMOS device from providing influences to the bipolar transistors.

A p-well is provided between the CMOS device region and the bipolar transistor region wherein the p-well extends downwardly to reach a p-type semiconductor substrate so that the p-well electrically isolates the CMOS device region from the bipolar transistor region.

Since, however, the provision of the n-well region and the p-well region for isolation between the CMOS device region from the bipolar transistor region makes it difficult to increase the density of the integration.

In the above circumstances, it had been required to develop a novel Bi-CMOS semiconductor device free from the above problems.

SUMMARY OF THE INVENTION

Accordingly, it is an object of the present invention to provide a novel Bi-CMOS semiconductor device free from the above problems.

It is a further object of the present invention to provide a novel Bi-CMOS transistor-transistor logic circuit operable by a single power voltage level, which is allowable to increase the density of integration.

It is a still further object of the present invention to provide a novel Bi-CMOS semiconductor device having a bipolar transistor and a CMOS device applied with different power voltages from each other, which is allowed to suppress noise.

It is yet a further object of the present invention to provide a novel Bi-CMOS semiconductor device allowed to reduce an occupied area and increase the density of integration.

It is a further more object of the present invention to provide a novel Bi-CMOS semiconductor device having a reduced isolation region for isolating the bipolar transistor region and the CMOS transistor region.

It is still more object of the present invention to provide a novel Bi-CMOS semiconductor device applicable to various combinations of logic circuits.

The above and other objects, features and advantages of the present invention will be apparent from the following descriptions.

The present invention provides a Bi-CMOS semiconductor device having a CMOS device region and a bipolar transistor region, wherein the bipolar transistor has a collector region of a first conductivity type and the CMOS region has at least one element region of a second conductivity type which is positioned adjacent to the collector region as well as wherein a single buried layer of the first conductivity type is provided which extends under the element region of the CMOS region and the collector region.

BRIEF DESCRIPTION OF THE DRAWINGS

Preferred embodiments according to the present invention will be described in detail with reference to the accompanying drawings.

PREFERRED EMBODIMENTS

Figure 1:
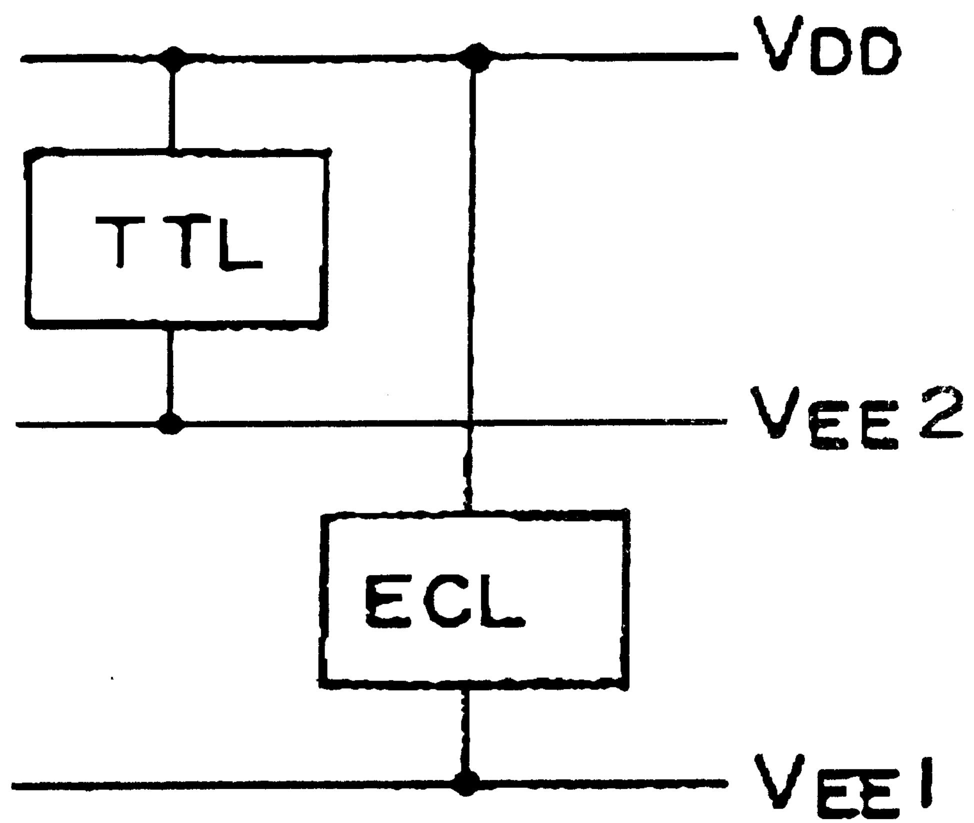
FIG. 1 is a block diagram illustrative of a logic circuit to which a novel Bi-CMOS semiconductor device in accordance with the present invention is applicable

First Embodiment:

A first embodiment according to the present invention will be described in detail with reference to the accompanying drawings. FIG. 1 is a block diagram illustrative of a logic circuit to which a novel Bi-CMOS semiconductor device in accordance with the present invention is applicable. A semiconductor device has a transistor-transistor logic circuit (TTL circuit) and an emitter-coupled logic circuit (ECL circuit). The emitter-coupled logic circuit (ECL circuit) is connected to a high voltage line applied with a high voltage of Vdd and a low voltage line applied with a low voltage of Vee1. The transistor-transistor logic circuit (TTL circuit) is connected to the high voltage line applied with the high voltage of Vdd and an intermediate voltage line applied with an intermediate voltage of Vee2. The high voltage of Vdd is, for example, 3.3V. The intermediate voltage of Vee2 is, for example, 0V The low voltage of Vee1; is, for example, −2V.

Alternatively, the high voltage of Vdd may be 0V. The Intermediate voltage of Vee2 may be −3.3V. The low voltage of Vee1 may be −4.5V.

Further alternatively, the high voltage of Vdd may be 0V. The intermediate voltage of Vee2 may be −3.3V. The low voltage of Vee1 may be −5.2V.

As described above, the transistor-transistor logic circuit (TTL, circuit) and the emitter-coupled logic circuit (ECL circuit) are applied with different power voltages. The emitter-coupled logic circuit (ECL circuit) comprises bipolar transistors, whilst the transistor-transistor logic circuit (TTL circuit) comprises an integration of a CMOS device and a bipolar transistor.

Figure 2A:
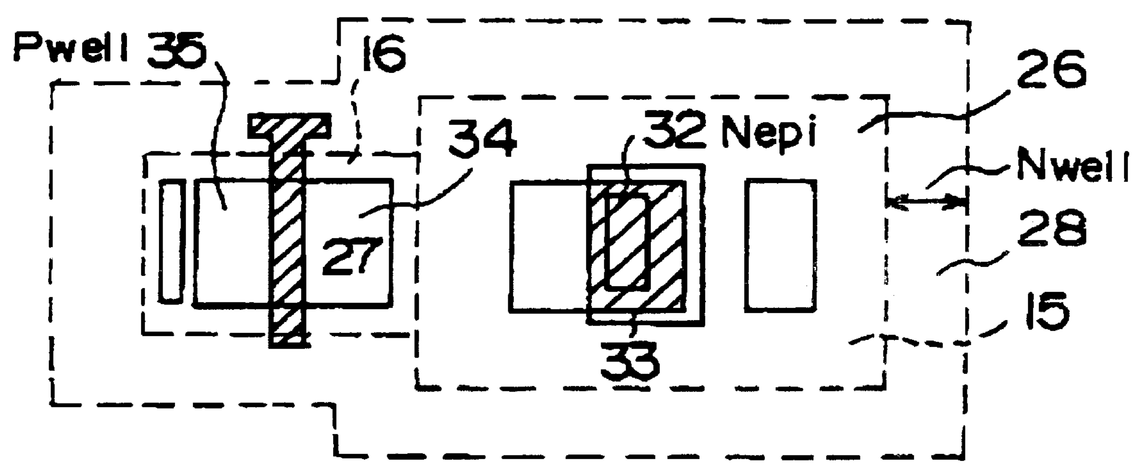
FIG. 2A is a fragmentary plane view illustrative of a novel Bi-CMOS semiconductor device in a first embodiment in accordance with the present invention.
Figure 2B:
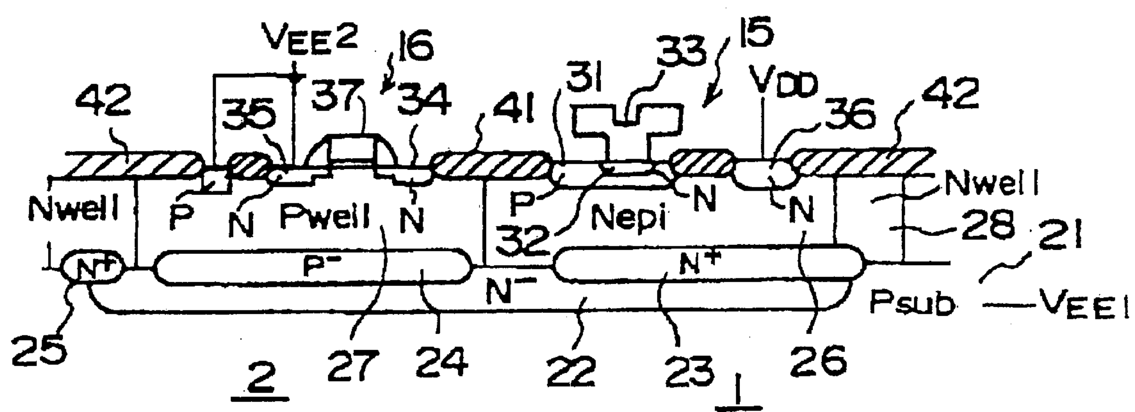
FIG. 2B is a fragmentary cross sectional elevation view illustrative of a novel Bi-CMOS semiconductor device of FIG. 2A in a first embodiment in accordance with the present invention
Figure 3:
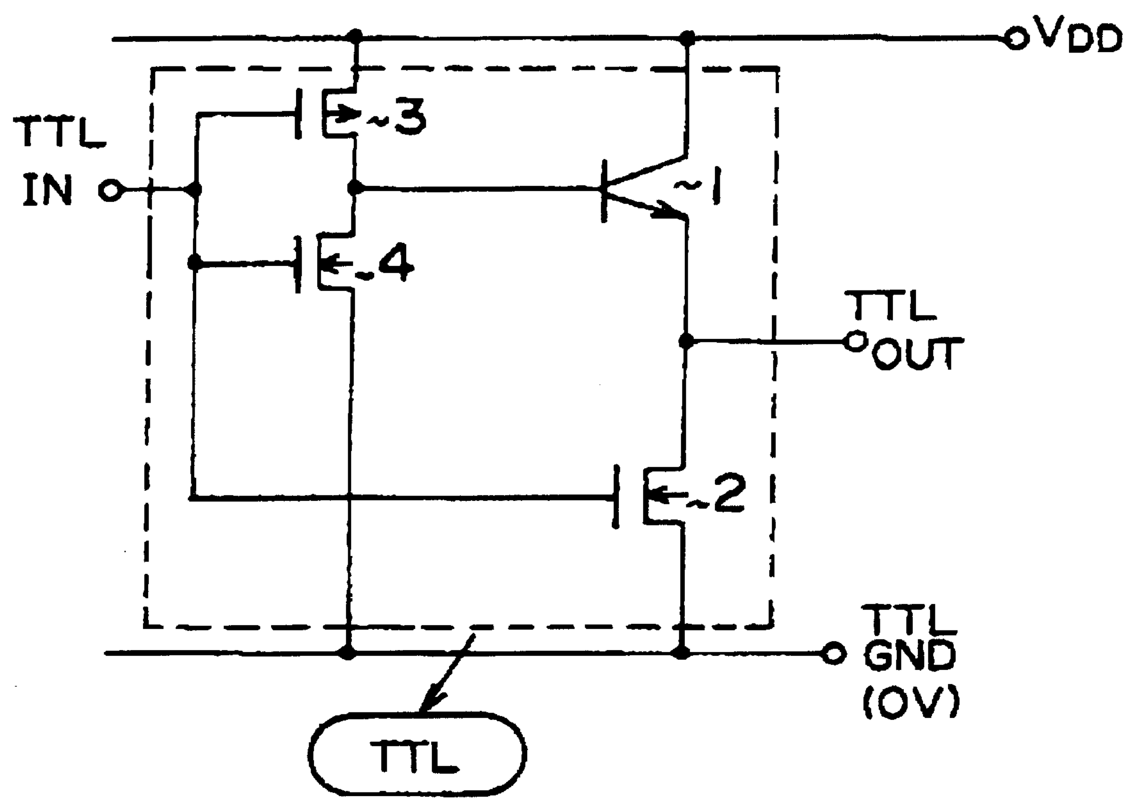
FIG. 3 is a circuit diagram illustrative of a transistor-transistor logic circuit to which a novel Bi-CMOS semiconductor device in accordance with the present invention is applicable.

The following descriptions will focus on the transistor-transistor logic circuit (TTL circuit) of the integration of the CMOS device and the bipolar transistor. FIG. 2A is a fragmentary plane view illustrative of a novel Bi-CMOS semiconductor device. FIG. 2B is a fragmentary cross sectional elevation view illustrative of a novel Bi-CMOS semiconductor device of FIG. 2A. FIG. 3 is a circuit diagram illustrative of a transistor—transistor logic circuit to which a novel Bi-CMOS semiconductor device is applicable. The transistor-transistor logic circuit (TTL circuit) of FIG. 3 bas an input terminal IN and an output terminal OUT. The transistor—transistor logic circuit (TTL circuit) is connected to a high voltage line Vdd and a ground line GND. The transistor-transistor logic circuit (TTL circuit) comprises an n-p-n bipolar transistor 1, an n-channel MOS transistor 2, a p-channel MOS transistor 3 and an n-channel MOS transistor 4. Gates of the n-channel MOS transistor 2, the p-channel MOS transistor 3 and the n-channel MOS transistor 4 are commonly connected to the input terminal IN. Drains of the p-channel MOS transistor 3 and the n-channel MOS transistor 4 are commonly connected to a base of the n-p-n bipolar transistor 1. A source of the p-channel MOS transistor 3 is connected to the collector of the n-p-n bipolar transistor 1. An emitter of the n-p-n bipolar transistor I and a drain of the n-channel MOS transistor 2 are commonly connected to the output terminal OUT. Sources of the n-channel MOS transistor 2 and the n-channel MOS transistor 4 are commonly connected to the ground line. The n-channel MOS transistors 2 and 4 are positioned adjacent to the n-p-n bipolar transistor 1.

FIGS. 2A and 2B are illustrative of the integration of the n-p-n bipolar transistor 1 and the n-channel MOS transistor 2, whilst the n-p-n bipolar transistor and the p-channel MOS transistor are not illustrated even the arrangements thereof are the same as those of the n-p-n bipolar transistor and the n-channel MOS transistor.

The n-p-n bipolar transistor 1 is formed in an n-p-n bipolar transistor region 15, whilst an n-channel MOS transistor 2 of the CMOS device is formed in an n-channel MOS region 16. No isolation well region is provided between the n-p-n bipolar transistor region 15 and the n-channel MOS region 16. A distance between the n-p-n bipolar transistor region 15 and the n-channel MOS region 16 can therefore be made narrow.

In this case as illustrated in FIG. 3, a collector of the n-p-n bipolar transistor 1 is applied with a high voltage Vdd, whilst a source of the n-channel MOS transistor 2 is applied with the ground voltage as the intermediate voltage level Vee2.

With reference to FIG. 2B, the device is formed over a p-type semiconductor substrate 21, which has the n-p-n bipolar transistor region 15 and the n-channel MOS region 16. A low impurity concentration n−-type first buried layer 22 is formed which extends over the p-type semiconductor substrate 21 in the n-p-n bipolar transistor region 15 and the n-channel MOS region 16 A high impurity concentration n+-type second buried layer 23 is formed which extends over the low impurity concentration n−-type first buried layer 22 in the n-p-n bipolar transistor region 15 and also extends partially into the p-type semiconductor substrate 21. A high impurity concentration p−-type third buried layer 24 is formed which extends over the low impurity concentration n−-type first buried layer 22 in the n-channel MOS region 16. A high impurity concentration n+-type fourth buried layer 25 is formed outside the high impurity concentration p−-type third buried layer 24 so that the high impurity concentration n+-type fourth buried layer 25 partially overlaps the low impurity concentration n−-type first buried layer 22.

An n-type epitaxial layer 26 is formed which extends over the first to fourth buried layers 22, 23, 24 and 25 and also over the p-type substrate 21. A p-well 27 is formed in the n-type epitaxial layer 26 and in the n-channel MOS transistor region 16. An n-well 28 is formed which surrounds the n-type epitaxial layer 26 and the p-well 27. The n-well 28 partially overlaps the low impurity concentration n−-type first buried layer 22 and is positioned outside thereof so that the low impurity concentration n−-type first buried layer 22 is terminated with the n-well 28.

A p-type base region 31 and an n-type emitter region 32 are formed in the n-p-n bipolar transistor region 15. An emitter electrode 33 is provided in the n-type emitter region 32. The emitter electrode 33 comprises a polysilicon film.

An n-type drain region 34, an n-type source region 35 and a p-type well electrode region 37 are formed on a surface of the p-well in the n-channel MOS transistor region 15. An n+-type collector electrode region 36 is formed on a surface of the n-type epitaxial layer 26 in the n-p-n bipolar transistor region 15. A collector region of the n-p-n bipolar transistor comprises the n-type epitaxial layer 26 and the n+-type collector electrode region 36.

A p-n junction comprises a boundary between the n-type epitaxial layer 26 and the p-well 27 A field oxide film 41 is formed which extends over the p-n junction of the boundary between the n-type epitaxial layer 26 and the p-well 27. Field oxide films 42 are also formed which cover the n-well 28.

A width of the field oxide film 41 between the base region 31 and the drain region 34 is made narrow by about one third as compared to the conventional device, for example, the above third conventional device of Japanese patent publication No. 7-44231. In the above third conventional device, the width of not less than 10 micrometers of the field oxide film is required.

The collector region of the n-p-n bipolar transistor is applied with the high voltage of Vdd. The source electrode of the n-channel MOS transistor is applied with the intermediate voltage Vee2 or the ground voltage. The p-type substrate is also applied with the ground voltage.

The n-p-n bipolar transistor 1 is completely isolated from the p-type substrate 21 by the p-n junction formed between the first buried layer 22 and the p-type substrate 21. The n-channel MOS transistor is also completely isolated from the p-type substrate 21. Thus, it is possible to completely cut off noises from the p-type substrate 21.

On the other hand, the collector electrode region 36 of the n-p-n bipolar transistor 32 has the same conductivity type as that of the epitaxial layer 26, the second buried layer 23 and the first buried layer 22, for which reason the collector electrode region 36 is electrically conductive to the first buried layer 22 whereby the same voltage as the high voltage Vdd is also applied to the first source region 35 of the n-channel MOS transistor 2. The source region 35 of the n-channel MOS transistor 2 is grounded and the collector electrode 33 and the drain region 34 of the n-channel MOS transistor 2 are electrically connected to each other so that noises from the n-channel MOS transistor 2 may transmit to the n-p-n bipolar transistor 1.

However, the n-p-n bipolar transistor 1 shows digital operations but not so sensitive to the noises, for which reason the bipolar transistor may substantially be free from the influence of the noises from the CMOS device.

No p-well or n-well are provided between the n-p-n bipolar transistor 1 and the n-channel MOS transistor 2, for which reason when the p-type substrate 21 is grounded, it is possible to prevent noise from the substrate 21. Further, the bipolar transistor is allowed to show digital operations so as to eliminate substantial influences of noises from the logic CMOS circuit. As a result, it is possible to largely reduce the occupied area of the transistor-transistor logic circuit (TTL circuit).

Figure 4:
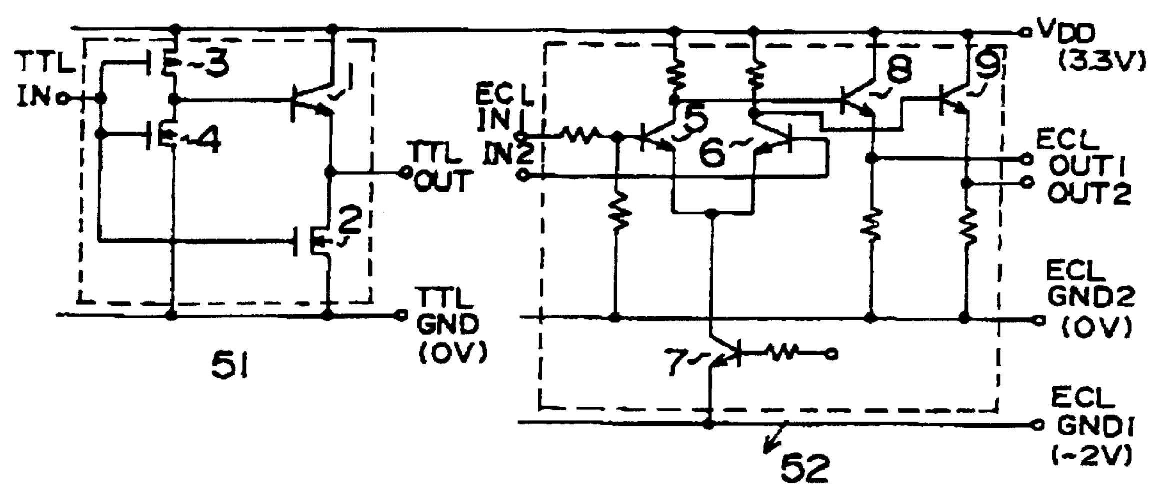
FIG. 4 is a circuit diagram illustrative of other circuits to which a novel Bi-CMOS semiconductor device in accordance with the present invention is applicable.

FIG. 4 is a circuit diagram illustrative of other circuits to which a novel Bi-CMOS semiconductor device in accordance with the present invention is applicable. The circuit comprises a transistor-transistor logic circuit (TTL circuit) 51 and an emitter-coupled logic circuit (ECL circuit) 52. The transistor-transistor logic circuit (TTL circuit) 51 has an input terminal IN, an output terminal OUT, an n-p-n bipolar transistor 1, an n-channel transistor MOS 2, a p-channel MOS transistor 3, and an n-channel MOS transistor 4. The transistor-transistor logic circuit (TTL circuit) 51 is connected to a first power terminal applied with a high voltage Vdd of 3.3V and a second power terminal applied with the ground voltage of 0V.

The emitter-coupled logic circuit (ECL circuit) 52 has a first power terminal applied with a high voltage Vdd of 3.3V, a second power terminal applied with the ground voltage of 0V and a third power terminal applied with a low voltage of −2V. The emitter-coupled logic circuit (ECL circuit) 52 also has n-p-n bipolar transistors 5 and 6 with emitters commonly connected to each other, an n-p-n bipolar transistor 7 with a collector connected to the emitters of the n-p-n bipolar transistors 5 and 6 and output bipolar transistors 8 and 9 connected to the collectors of the n-p-n bipolar transistors 5 and 6. Emitters of the output bipolar transistors 8 and 9 are connected to the second power terminal through resistances. An emitter of the n-p-n bipolar transistor 7 is connected to the third power terminal.

In view of the circuit layout, the n-p-n bipolar transistor of the transistor-transistor logic circuit (TTL circuit) 51 is adjacent to the n-channel transistor MOS 2 and the n-channel MOS transistor 4 and also adjacent to any one of the n-p-n bipolar transistors 5, 6 and 7. The n-channel transistor MOS 2 and the n-channel MOS transistor 4 of the transistor-transistor logic circuit (TTL circuit) 51 are adjacent to the p-channel MOS transistor 63.

For those reason, the n-p-n bipolar transistors 5, 6 and 7 of the emitter-coupled logic circuit (ECL circuit) 52 have equivalent positions. The n-channel transistor MOS 2 and the n-channel MOS transistor 4 of the transistor—transistor logic circuit (TTL circuit) 51 also have equivalent positions. The n-channel MOS transistor MOS 2 of the transistor-transistor logic circuit (TTL circuit) 51 and the n-p-n bipolar transistor 7 of the emitter-coupled logic circuit (ECL circuit) 52 are adjacent to the n-p-n bipolar transistor 1 of the transistor-transistor logic circuit (TTL circuit) 51. The p-channel MOS transistor 3 is adjacent to the n-channel MOS transistor 4 of the transistor—transistor logic circuit (TTL circuit) 51.

Figure 5:
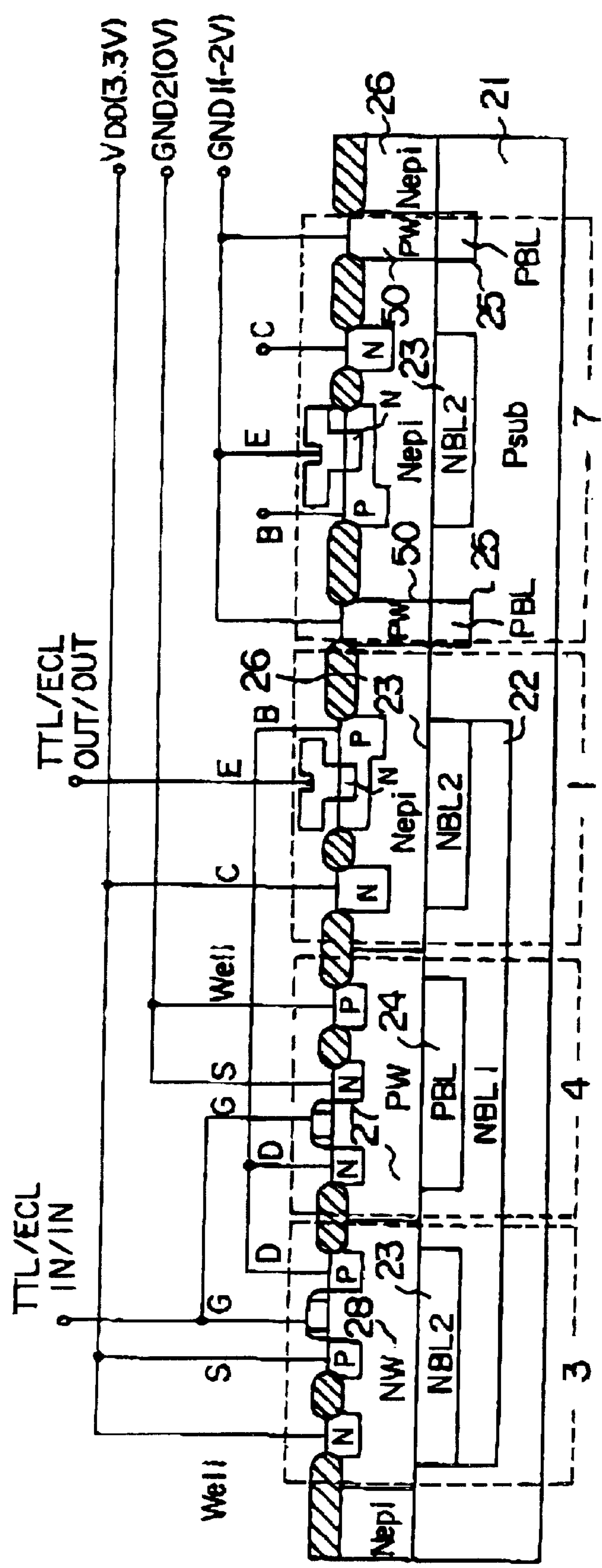
FIG. 5 is a fragmentary cross sectional elevation view illustrative of other circuits to which a novel Bi-CMOS semiconductor device of FIG. 4 in accordance with the present invention is applicable.

FIG. 5 is a fragmentary cross sectional elevation view illustrative of other circuits to which a novel Bi-CMOS semiconductor device of FIG. 4 in accordance with the present invention is applicable. A low impurity concentration n−-type first buried layer 22 is formed which extends over the regions in which the n-p-n bipolar transistor 1, the n-channel MOS transistor 4 and the p-channel MOS transistor 3. The right side of the first buried layer 22 does not reach the region of the n-p-n bipolar transistor 7 A high impurity concentration n+-type second buried layer 23 is formed in the first buried layer 22 positioned in the n-p-n bipolar transistor 1 and the p-channel MOS transistor 3. An edge of the second buried layer 23 is aligned to the edge of the first buried layer 22. The second buried layer 23 extends to the region of the n-p-n bipolar transistor 7. A high impurity concentration p+-type second buried layer 24 is formed in the first buried layer of the n-channel MOS transistor 4. A fourth buried layer 25 is formed which surround the n-p-n bipolar transistor 7. An n-type epitaxial layer 26 is formed which extends over the p-type substrate 21. A p-well 50 is formed between the n-p-n bipolar transistor 1 and the region of the n-p-n bipolar transistor 7. A p-well 27 is formed in the n-type epitaxial layer 26. An n-well 28 is formed in the p-channel MOS transistor 3 adjacent to the p-well 27.

Also n-type source and drain regions are formed in the p-well 27 of the n-channel MOS transistor 4. The p-well connected to the second power terminal is formed therein. In the region of the p-channel MOS transistor 3, p-type drain and source regions are formed and an n-well connected to the first power terminal is formed.

In the region of the n-p-n bipolar transistor 1, a p-type base region and an n-type emitter region are provided. In the n-type epitaxial layer 26, a collector electrode region of n+-type is formed. In the emitter region, an emitter electrode is formed whereby an emitter of the n-p-n bipolar transistor 1 is formed.

Drains of the n-channel MOS transistor 4 and the p-channel MOS transistor 3 are connected to the base of the n-p-n bipolar transistor 1 Gates of the n-channel MOS transistor 4 and the p-channel MOS transistor 3 are commonly connected to the input terminal IN of the transistor—transistor logic circuit (TTL circuit) 51. The source of the p-channel MOS transistor 3 and the n-well 28 are commonly connected so as to be connected with the collector of the n-p-n bipolar transistor 1 to the first power terminal Vdd. The source of the n-channel MOS transistor 4 is connected to the second power terminal GND together with the p-well 37.

The emitter of the n-p-n bipolar transistor 7 and the p-well 50 are connected to the third power terminal.

The p-type substrate 21 is electrically connected to the third power terminal and applied with a low voltage of −2V The n-p-n bipolar transistor 7 is completely isolated from the substrate 21 because the n-p-n bipolar transistor 7 is formed in the region isolated by the n+-type second buried layer 23 and the n-type epitaxial layer 26 from the p-type substrate 21 connected with the p-well 50 and the buried layer 25. No noise is generated from the n-p-n bipolar transistor 7. The n-p-n bipolar transistor 1 is also electrically isolated by the n-type first and second buried layers 22 and 23 from the p-type substrate 21.

No isolation region such as p-well or n-well is formed between the n-p-n bipolar transistor 1 and the n-channel MOS transistor 4. The collector region of the n-p-n bipolar transistor 1 is directly bounded to the p-well 27 of the n-channel MOS transistor 4.

The collector region of the n-p-n bipolar transistor 1 is, however, applied with the voltage 3.3V, whilst the p-well of the n-channel MOS transistor 4 adjacent to the n-p-n bipolar transistor 1 is applied with the ground voltage, for which reason no noise is generated between the n-p-n bipolar transistor 1 and the n-channel MOS transistor 4. Since, further, the n-type first buried layer 22 is formed between the p-type substrate 21 and the p-well 27 of the n-channel MOS transistor 4, no noise is generated between the substrate 21 and the n-channel MOS transistor 4.

The n-well 28 of the p-channel MOS transistor 3 and the collector region of the n-p-n bipolar transistor I are electrically connected to each other through the n-type first and second buried layers 22 and 23. The n-well 28 of the p-channel MOS transistor 3 and the collector region of the n-p-n bipolar transistor 1 are applied with the high voltage 3.3V.

Even if the noises generated from the p-channel MOS transistor 3 are transmitted to the n-p-n bipolar transistor 1, then the n-p-n bipolar transistor 1 shows digital operations, for which reason there is required no sensitive characteristic to the noises. The circuit is free from the substantive influence due to the noises.

The device of FIG. 5 may be formed as follows.

Figure 6A:
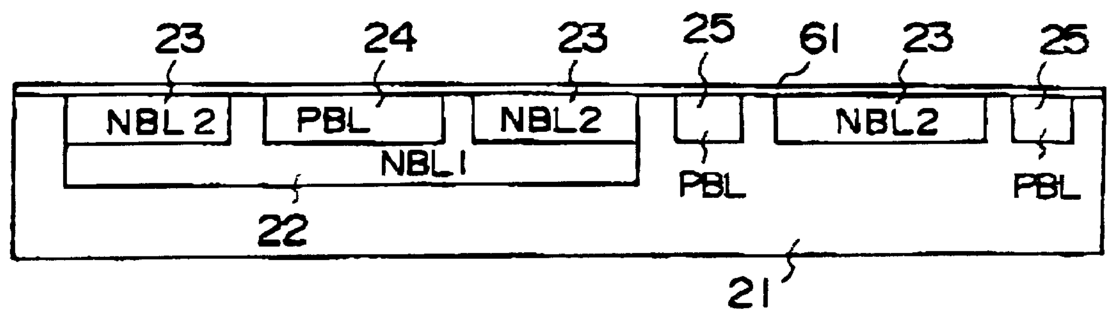
FIGS. 6A through 6J are fragmentary cross sectional elevation view illustrative of a method of forming other circuits to which a novel Bi-CMOS semiconductor device of FIG. 4 in accordance with the present invention is applicable.

With reference to FIG. 6A, a p-type substrate 21 is prepared. A surface of the substrate 21 is then subjected to a thermal oxidation at 900– 1000° C. to form an oxide film 61 having a thickness of 30–50 nanometers. Subsequently, phosphorus is ion-implanted through the oxide film 61 into the substrate 21 at a dose of 1E13-1E14/cm2 for subsequent heat treatment at 1100–1300° C. to form an n-type first buried layer 22. Arsenic is ion-implanted through the oxide film 61 into the substrate 21 at a does of 1E15-1E16/cm2 for subsequent heat treatment at 1000–1100° C. to form an n+-type second buried layer 23 which is shallower than the n-type first buried layer 22. Boron is ion-implanted through the oxide film 61 into the substrate 21 at a does of 1E13-1E14/cm2 for subsequent heat treatment at 1000–1100° C. to form a p+-type third buried layer 24 which is shallower than the n-type first buried layer 22. The p+-type third buried layer 24 extends not only within the first buried layer 22 but also around the second buried layer 23.

The oxide film 61 is removed before an n-type epitaxial layer 26 is entirely deposited by chemical vapor deposition method over the substrate 21 and the buried layers.

Figure 6B:
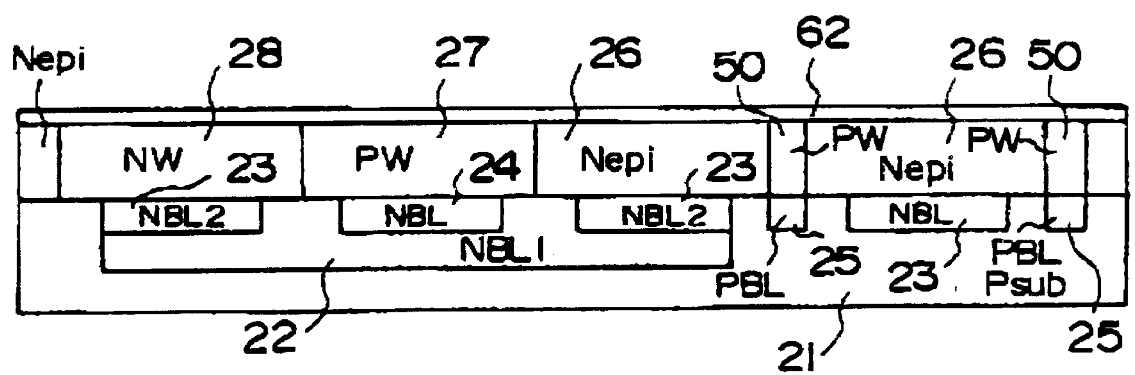

With reference to FIG. 6B, the surface of the n-type epitaxial layer 26 is subjected to a thermal oxidation at 900–1000° C. to form an oxide film 62 having a thickness of 30–50 nanometers Boron is ion-implanted through the oxide film 62 into the substrate 21 at a does of 1E12-1E13/cm2 for subsequent heat treatment at 1000–1100° C. to form p-wells which extend to the p+-type third buried layer 24 and the fourth buried layer 25 respectively. Phosphorus is ion-implanted through the oxide film 62 into the substrate 21 at a dose of 1E12-1E13/cm2 for subsequent heat treatment at 1000–1100° C. to form an n-well which extends to the n+-type second buried layer 23.

Figure 6C:
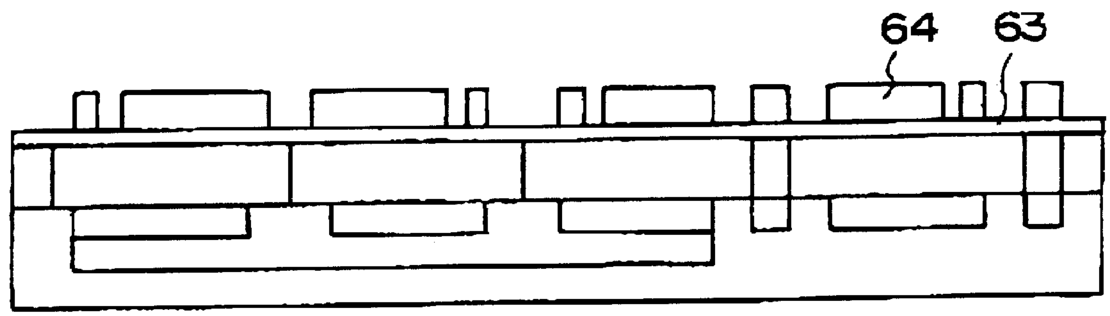

With reference to FIG. 6C, the oxide film 62 is removed. A thermal oxidation is carried out at 1000–1100° C. to form an oxide film 63 having a thickness of 30–50 nanometers. A silicon nitride film having a thickness of 200–300 nanometers is deposited by a chemical vapor deposition for subsequent photo-etching process to leave the silicon nitride film 64 over predetermined regions.

Figure 6D:
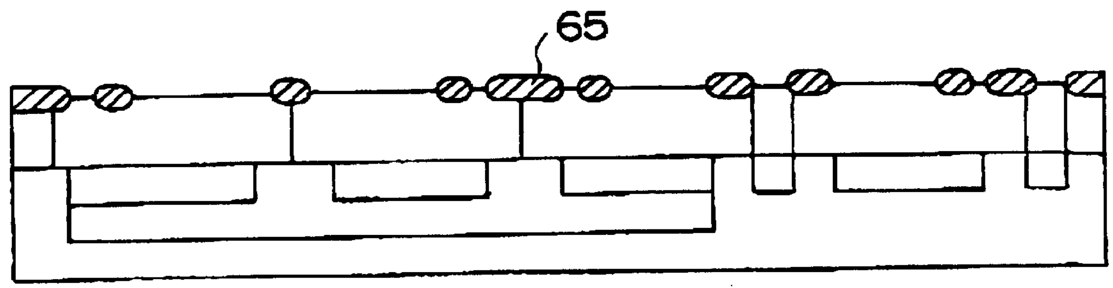

With reference to FIG. 6D, a selective thermal oxidation is carried out at 1000–1100° C. by use of the silicon nitride film 64 as a mask to form field oxide films 65 having a thickness of 400–600 nanometers. The used silicon nitride film 64 is then removed to leave the field oxide film 65.

Figure 6E:
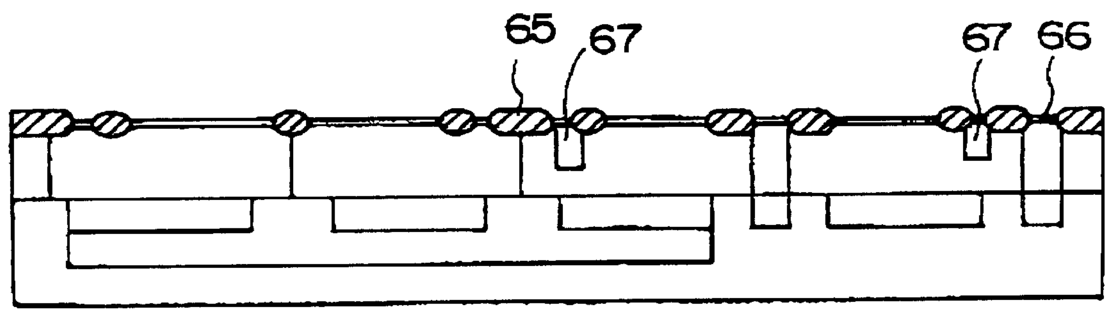

With reference to FIG. 6E, a thermal oxidation is carried out at 900–1000° C. to form an oxide film 66 having a thickness of 30–50 nanometers. Phosphorus is ion-implanted through the oxide film 66 into the substrate 21 at a does of 1E15-1E16/cm2 for subsequent heat treatment at 900–1000° C. to form n+-type diffusion collector electrode regions. The oxide film 66 is removed.

Figure 6F:
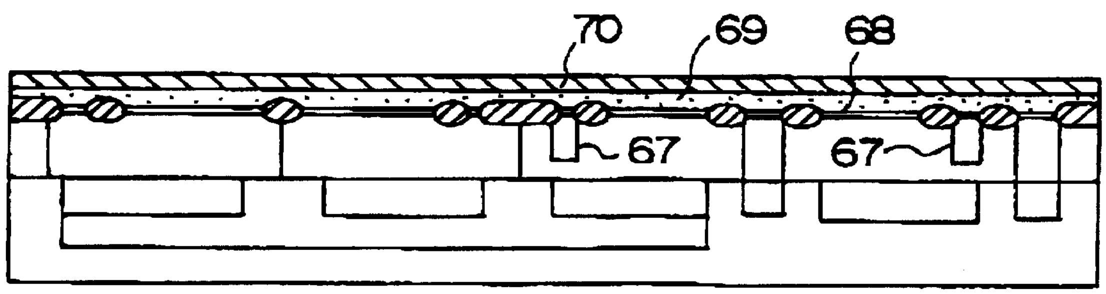

With reference to FIG. 6F, a thermal oxidation is carried out at 750–850° C. to form a gate oxide film 68 having a thickness of 10–20 nanometers. An n-type impurity doped polysilicon film 69 having a thickness of 100–200 nanometers is deposited over the gate oxide film 68 by a chemical vapor deposition. A tungsten silicide film 70 having a thickness of 100–200 nanometers is formed by sputtering method.

Figure 6G:
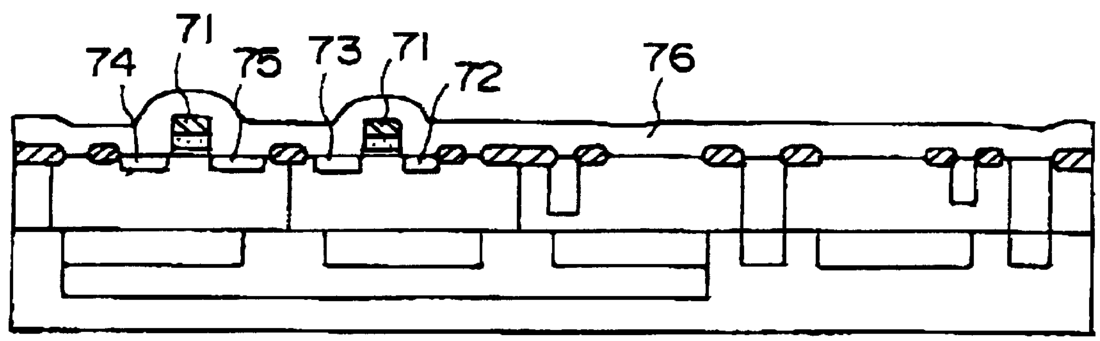

With reference to FIG. 6G, the tungsten silicide film 70, the polysilicon film 69 and the gate oxide film 68 are selectively etched by photo-etching process to form gate oxide films 68 and gate electrodes 71. The oxide film 68 remains over the n-channel and p-channel MOS transistor regions 4 and 3. The gate electrodes 71 are used as masks so that phosphorus is selectively ion-implanted through the oxide film 68 into the n-channel MOS transistor region 4 at a dose of 1E13-1E14/cm2 for subsequent heat treatment at 800–900° C. to form p-type source and drain regions 74 and 75. A high temperature oxide film 76 having a thickness of 20–30 nanometers is deposited by a chemical vapor deposition.

Figure 6H:
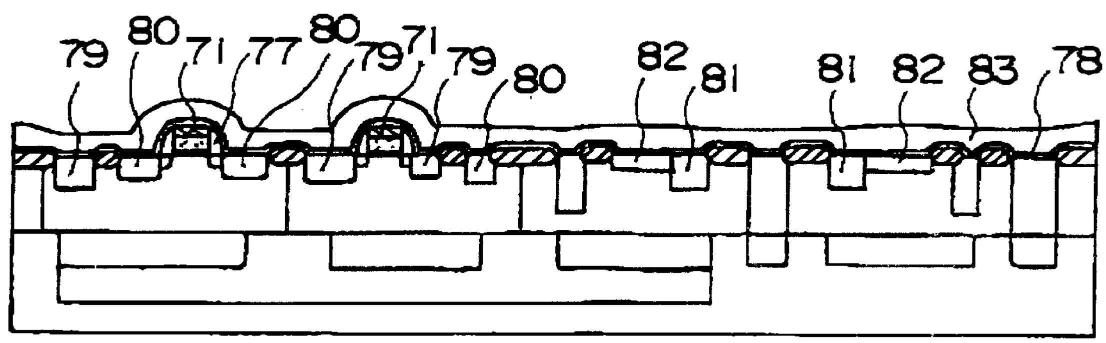

With reference to FIG. 6H, entire anisotropic dry etching to the high temperature oxide film 76 to form side wall insulating films 77 on side walls of the gate electrodes 71. An oxide film 78 having a thickness of 20–30 nanometers is deposited by a chemical vapor deposition method. The gate electrodes 71 and the side wall insulation films 77 are used as masks so that arsenic is selectively ion-implanted through the oxide film 78 into the source and drain region 72 and 73 at a does of 1E15-1E16/cm2. Boron is selectively ion-implanted through the oxide film 78 into the source region 74 and 75 and external base region of the bipolar transistors 1 and 7 at a dose of 1E15-1E16/cm2. Boron is selectively ion-implanted through the oxide film 78 into the source region 74 and 75 and intrinsic base regions of the bipolar transistors 1 and 7 at a dose of 1E13-1E14/cm2. Subsequently, a heat treatment is carried out at 800–900° C. to form n+-type diffusion layers 79 as source and drain regions of the n-channel MOS transistor 4 and a well plug electrode of the p-channel MOS transistor 3 as well as form p+-type diffusion layers 80 as source and drain regions of the p-channel MOS transistor 3 and a well plug electrode of the n-channel MOS transistor 4, in addition to form a p+-type diffusion layer 81 as an external base region and a p−-type diffusion layer 82 as the intrinsic base region. A high temperature oxide film 83 having a thickness of 200–300 nanometers is deposited by a chemical vapor deposition method.

Figure 6I:
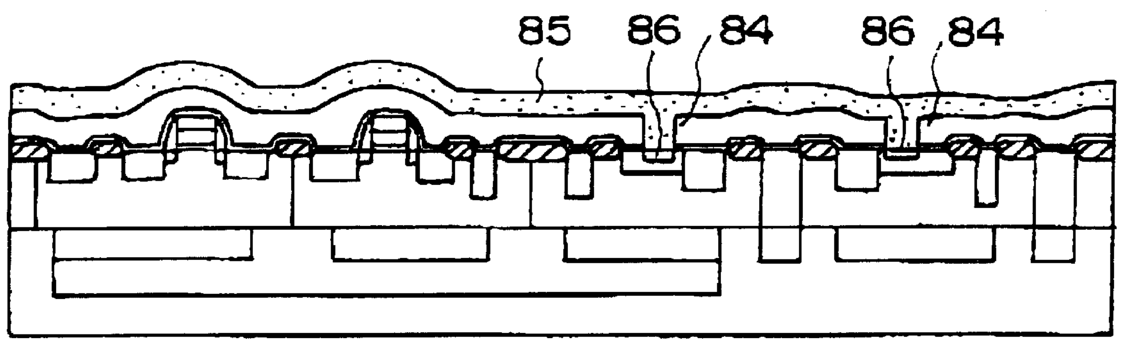

With reference to FIG. 6I, the high temperature oxide film 83 is etched by the photo-etching process to form openings 84 to partially show the intrinsic base regions of the transistors 1 and 7. Subsequently, a polysilicon film 85 having a thickness of 200–300 nanometers by a chemical vapor deposition method Arsenic is ion-implanted into the polysilicon film 85 at a does of 1E15-1E16/cm1 for subsequent heat treatment at 800–900° C. to form n+-type diffusion layers 86 as the emitter regions of the transistors 1 and 7.

Figure 6J:
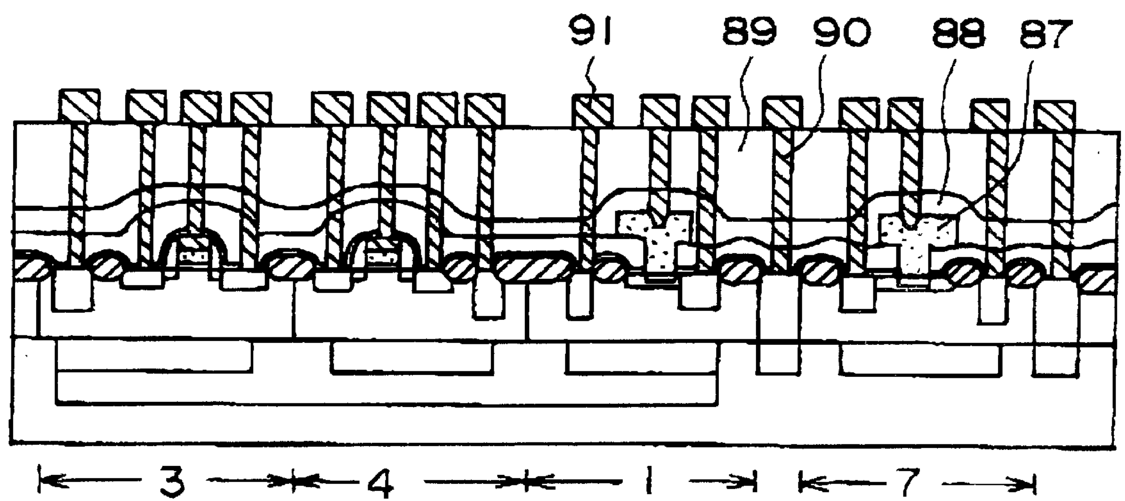

With reference to FIG. 6J, the polysilicon film 85 is etched by the photo-etching process to form emitter electrodes 87 of the transistors 1 and 7. An oxide film 88 having a thickness of 100–200 nanometers is deposited by the chemical vapor deposition method. A boro-phospho-silicate glass film 89 as an inter-layer insulator having a thickness of 800–1200 nanometers is deposited by the chemical vapor deposition method. The oxide film 78, the high temperature oxide film 88 and the boro-phospho-silicate glass film 89 is etched by the photo-etching process to form openings 90. An aluminum layer having a thickness of 500–1000 nanometers is deposited by a sputtering method and subsequent photo-etching process thereof to form aluminum electrodes 91.

The above present invention is applicable to when a ground voltage is commonly applied. Further, the above present invention is applicable to a combination of he transistor-transistor logic circuit and the gunning transistor logic circuit.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A Bi-CMOS semiconductor device comprising:

a CMOS device region and a bipolar transistor region, said bipolar transistor region comprising a collector region of a first conductivity type and a collector contact region interior to a perimeter of said collector region, said CMOS device region comprising at least one element region of a second conductivity type which is positioned adjacent to said collector region, a single buried layer of the first conductivity type extending under said element region of the CMOS device region and said collector region, and a first conductivity type well region contacting and surrounding said element region and said perimeter of said collector region, said first conductivity type well region and said collector region being of differing impurity concentrations.

2. The Bi-CMOS semiconductor device as claimed in claim 1, wherein a second buried layer of the first conductivity type is formed in the first buried layer in the collector region.

3. The Bi-CMOS semiconductor device as claimed in claim 1, wherein a third buried layer of the second conductivity type is formed in the first buried layer in the CMOS device region.

4. The Bi-CMOS semiconductor device as claimed in claim 1, wherein the collector region and the element region are in contact with each other.

5. The Bi-CMOS semiconductor device as claimed in claim 1, wherein the first buried layer is formed in a substrate of the second conductivity type.

6. The Bi-CMOS semiconductor device as claimed in claim 5, wherein a second buried layer of the first conductivity type is formed in the first buried layer in the collector region and a third buried layer of the second conductivity type is formed in the first buried layer in the CMOS device region.

7. The Bi-CMOS semiconductor device as claimed in claim 6, wherein a p-n junction is formed between the collector region and the element region.

8. The Bi-CMOS semiconductor device as claimed in claim 7, wherein the collector region and the element region as well as the substrate are applied with different voltages.

9. A Bi-CMOS semiconductor device comprising:

a first region comprising a first bipolar transistor with a collector region of a first conductivity type, a first MOS transistor with an element region of a second conductivity type, said first MOS transistor element region being located at a first end adjacent to said first bipolar transistor collector region, and a second MOS transistor with an element region of the first conductivity type, said second MOS transistor element region being located at a first end adjacent to a second end of said first MOS transistor element region, a first buried layer of the first conductivity type embedded in a substrate of the second conductivity type and extending partially under said first bipolar transistor collector region and said first and second MOS transistor element regions such that a portion of said first bipolar transistor collector region and a portion of said second MOS transistor element region are in contact with said substrate; and a second region adjacent said first region, said second region comprising a second bipolar transistor surrounded by a surrounding buried layer of the second conductivity type, wherein said first bipolar transistor collector region and said second MOS transistor element region are adapted to share a first voltage, said first MOS transistor element region is adapted to be applied with a second voltage different from the first voltage, and said surrounding buried layer is adapted to be applied with a third voltage different from the first and second voltages.

10. The Bi-CMOS semiconductor device of claim 9, further comprising:

a first embedded region of the second conductivity type centered in said first buried layer of the first conductivity type and having an upper surface coplanar with an upper surface of said first buried layer;

a second embedded region of the first conductivity type located at a first end of said first buried layer and below said first bipolar transistor collector region, said second embedded region having an upper surface coplanar with the upper surface of the first buried layer and having an end surface aligned with an end surface of the first end of said first buried layer;

a third embedded region of the first conductivity type located at a second end of said first buried layer, said third embedded region having an upper surface coplanar with the upper surface of the first buried layer and having an end surface aligned with an end surface of the second end of said first buried layer;

a fourth embedded region of the first conductivity type, said fourth embedded region being surrounded by said surrounding buried layer and having upper and lower surfaces coplanar with the upper and lower surfaces of the first embedded region.

11. The Bi-CMOS semiconductor device of claim 9, wherein a p-n junction is formed between the first bipolar transistor collector region and said element region of said first MOS transistor.

* * * * *